(12) United States Patent
Asmus

(10) Patent No.: US 6,445,134 B1
(45) Date of Patent: Sep. 3, 2002

(54) INNER/OUTER COAXIAL TUBE ARRANGEMENT FOR A PLASMA PINCH CHAMBER

(75) Inventor: John F. Asmus, La Jolla, CA (US)

(73) Assignee: Environmental Surface Technologies, Norcross, GA (US)

( * ) Notice: Subject to any disclaimer, the term of this patent is extended or adjusted under 35 U.S.C. 154(b) by 0 days.

(21) Appl. No.: 09/727,247

(22) Filed: Nov. 30, 2000

Related U.S. Application Data
(60) Provisional application No. 60/168,098, filed on Nov. 30, 1999.

(51) Int. Cl.[7] .................................................. H01J 7/24
(52) U.S. Cl. ............................ 315/111.71; 315/111.01; 315/111.21
(58) Field of Search ....................... 315/111.01, 111.21, 315/111.71; 219/121.36

(56) References Cited

U.S. PATENT DOCUMENTS

| | | | |
|---|---|---|---|
| 4,042,848 A | 8/1977 | Lee ........................... 313/231.6 |
| 4,406,952 A | 9/1983 | Molen et al. ................. 307/104 |
| 4,424,102 A | 1/1984 | Brandeis et al. ......... 204/192 E |
| 4,450,568 A | 5/1984 | Asmus .......................... 372/76 |
| 4,504,964 A | 3/1985 | Cartz et al. .................. 378/119 |
| 4,536,884 A | 8/1985 | Weiss et al. ................. 378/119 |
| 4,543,231 A | 9/1985 | Ohkawa ....................... 376/133 |
| 4,618,971 A | 10/1986 | Weiss et al. ................... 378/34 |
| 4,621,577 A | 11/1986 | Bickes, Jr. et al. .......... 102/200 |
| 4,633,492 A | 12/1986 | Weiss et al. ................. 378/119 |
| 4,635,282 A | 1/1987 | Okada et al. .................. 378/34 |
| 4,849,670 A | 7/1989 | Hellwig et al. .............. 313/318 |
| 4,889,605 A | 12/1989 | Asmus et al. ........... 704/157.44 |
| 4,994,715 A * | 2/1991 | Asmus et al. ............ 315/111.71 |
| 5,204,506 A * | 4/1993 | Asmus et al. ........... 219/121.37 |
| 5,757,135 A | 5/1998 | Wiedijk ....................... 313/623 |
| 5,877,471 A * | 3/1999 | Huhn et al. ............. 219/121.49 |

* cited by examiner

Primary Examiner—Don Wong
Assistant Examiner—Thuy Vinh Tran
(74) Attorney, Agent, or Firm—Todd Deveau; Ryan A. Schneider; Troutman Sanders LLP

(57) ABSTRACT

A plasma pinch having an inner/outer coaxial tube arrangement, which nested tube arrangement yields a higher-performance pinchlamp than is capable with a single-tube configuration. Further, each tube contains a separate gas, the inner tube filled with Argon, and the outer tube filled with Helium. The inner/outer coaxial tube arrangement of the present invention facilitates the use of an inner tube to contain a volume of Argon gas as the working gas. The outer tube is coaxial with the inner tube, surrounding the inner tube with contained Helium gas. The configuration of an outer tube filled with Helium presents external pressures to the inner tube. The contained Helium gas in the outer tube, among other things, compresses and supports the walls of the inner tube, enabling the inner tube to be smaller in diameter than prior art plasma chambers, which chambers would shatter if made with as small a diameter as the present inner tube.

18 Claims, 3 Drawing Sheets

INNER/OUTER COAXIAL TUBE ARRANGEMENT FOR A PLASMA PINCH CHAMBER

CROSS-REFERENCE TO RELATED APPLICATION AND CLAIM OF PRIORITY

This application claims priority from U.S. provisional application Ser. No. 60/168,098, filed Nov. 30, 1999, entitled "AN INNER/OUTER COAXIAL TUBE ARRANGEMENT FOR A PLASMA PINCH CHAMBER.

BACKGROUND OF THE INVENTION

1. Field of the Invention

The present invention relates generally to a plasma pinch chamber, and more specifically to a nested, two-tube chamber used in connection with a high-Z, high-density, laser-guided, gas-embedded pinchlamp device.

2. Description of Related Art

In response to a variety of deficiencies in flashlamp technology, the next generation of high-power radiation resources evolved, that being the pinchlamp. One example of such a pinchlamp is the liquid-jet pinchlamp disclosed in U.S. Pat. No. 4,889,605 to Asmus et al. The chamber structure is basically a sealed tube. The liquid-jet pinchlamp is designed to shoot a thin stream or jet, generally 100 $\mu$m, of liquid decane into a vacuum chamber. As the decane traverses the chamber, a small amount of the liquid evaporates, creating a tenuous vapor cloud around the jet. A high electrical potential then is applied from one end of the jet to the other, and a small electrical current flows through the cloud in the chamber. The UV radiation from the cloud heats the liquid decane to the point of electrical conduction. Then a very large electrical current flows through the newly created conducting liquid, and heats it to very high temperatures so that high-intensity radiation is produced.

Another type of pinchlamp, the laser-guided gas-embedded pinchlamp, is somewhat similar to the liquid-jet pinchlamp, but improves upon the liquid-jet pinchlamp as it is free of the vacuum pumping element required in the liquid-jet pinchlamp device. Generally, a gas-embedded pinchlamp device comprises high pressure Argon gas contained within a large quartz chamber or tube. A beam from a very small laser is directed down the axis of the tube, and creates a straight and narrow, generally 5 mm in width, conductive path for a high power electrical discharge. The electrical discharge heats the dense Argon channel to a very high temperature, producing plasma.

Although several pinchlamp designs exist, most that utilize a high-temperature plasma require a suitable container or chamber to confine the plasma. Such confinement of the plasma is achieved by various techniques, which confinement devices are generally referred collectively to as a "plasma pinch". A plasma pinch is so called because the magnetic forces generated by the electric current through the plasma channel serve to pinch or compress the plasma toward its axis. The magnitude of the pinch effect is dependent upon the magnitude of the current creating the pinch. It is possible to select the current so as to form a stable pinch in which the thermal expansion of the plasma particles is generally offset by the pinch effect so that the plasma channel diameter remains substantially constant. A much greater current will eventually collapse a pinch to a fine filament.

Radiation is emitted relatively uniformly throughout the duration of a stable pinch, whereas, in the case of the collapsing pinch, most of the radiation occurs upon collapse of the pinch. An advantage of the collapsing pinch is that it compresses the electrical energy input into a pulse of relatively short duration. Because of this pulse compression, drive rise time requirements on the electrical system are relaxed. On the other hand, an advantage of the stable pinch is that it does not generate shock waves by sudden transformation of shape.

Plasma pinch systems have been employed for various applications. For instance, U.S. Pat. No. 4,042,848 to Lee describes a hypocyclodial pinch device for producing a dense plasma at thermonuclear fusion temperatures. U.S. Pat. No. 4,406,952 to Molen, et al. describes a switch for interrupting current using a plasma focus device.

In U.S. Pat. No. 4,450,568 to Asmus. there is disclosed a laser preconditioned plasma pinch, which emits vacuum ultraviolet radiation, for dissociating the molecules of a photolytic laser medium confined in a chamber. The preconditioning laser beam excites the gas particles in the vicinity of the chamber axis, for defining a preconditioned channel within which the plasma pinch is formed.

U.S. Pat. No. 4,543,231 to Ohkawa describes a plasma pinch used in fusion devices to produce a toroidal plasma. In U.S. Pat. No. 4,621,577 to Bickes Jr., et al., there is disclosed a plasma pinch formed by a discharge between electrodes, used for detonating explosives.

Another major application of the plasma pinch is its use in X-ray lithography. For example, in U.S. Pat. No. 4,424,102 to Brandeis. et al., a plasma pinch is disclosed and is used for reactive ion etching of semiconductor substrates. The etching process includes the use of magnetic fields in connection with the plasma pinch. U.S. Pat. Nos. 4,504,964; 4,536,884; 4,618,971; 4,633,492; and 4,635,282 also disclose various plasma pinch systems usable in X-ray lithography, whereby X-rays are generated by passing a high current through the plasma.

In U.S. patent application Ser. No. 09/140,645 there is disclosed a method and apparatus for utilizing a laser-guided gas-embedded pinchlamp device for the removal of coatings and contamination from surfaces. That device can be utilized for paint stripping, paint removal, or other coating and contamination removal processes, or in aseptic packaging and medical devices, methods for food preservation, large-area metals and ceramic glazing, semiconductor annealing and biochemical decontamination.

Referring now specifically to the chamber confining the plasma, the typical plasma pinch comprises pressurized gas in a large transparent tube. Alternatively, the pressurized gas is termed the working gas, and the tube referred to as a window. Present devices use a single tube to confine the gas. The hot radiating plasma created during use is prevented from coming into contact with the walls of the transparent tube because of the "pinch" caused by the ionization of the gas directly effected by, in the case of a laser-guided, gas-embedded pinchlamp, a laser beam that creates a conductive path for a high powered electrical discharge from electrodes.

The conventional chamber is manufactured from a quartz or sapphire window, and the conventional pressurized gas is Argon. The use of sapphire for the tube, instead of quartz, is particularly desirable for many reasons, including that a higher power is attainable without tube failure. Argon is a preferable working gas because it is a good light-generating gas (electron donating), and is economical.

In maximizing the performance (output power) of a plasma pinchlamp, generally four parameters specific to the plasma pinch architecture must be negotiated. Yet, adjusting these parameters in order to increase the output power of the pinchlamp can be difficult, as the beneficial adjustment of one parameter to maximize performance contradicts the beneficial adjustment of another. The four parameters are as follows:

1. The diameter of the tube that contains the working gas should be maximized so the wall of the tube will be as far as possible from the following so as not to shatter: (a) the heat of the plasma produced, (b) the shock wave from the production of the plasma, and (c) the pressures generated by the plasma.
2. The diameter of the tube that contains the working gas should be minimized so the volume of the working gas, which is both cold and absorbing, is minimized.
3. The working gas in which the pinch is embedded should be a high-Z gas to maximize the useful light output.
4. The working gas in which the pinch is embedded should be a low-Z gas to minimize absorption, and loss, of useful light in the cold surrounding working gas.

As is evident, it is contradictory to simultaneously satisfy both factors 1 and 2, and factors 3 and 4, with a plasma pinch having a single tube (one diameter), containing a single working gas. Yet, more powerful pinchlamps would be advantageous in a number of different applications. Thus, it can be seen that there is a need for the present invention, an improvement over the prior art plasma pinch devices, that satisfies the contradictory demands of a more powerful pinchlamp device than is presently known, by providing a double-wall confinement configuration for a plasma pinch. It is the provision such an inner/outer coaxial tube arrangement for a plasma pinch chamber, and a plasma pinchlamp that utilizes such a chamber, that the present invention is primarily directed.

SUMMARY OF THE INVENTION

Briefly described, in a preferred form, the present invention simultaneously satisfies the four contradictory factors of a plasma pinch identified as maximizing the performance of a pinchlamp device, by providing a plasma pinch having an inner/outer coaxial tube arrangement, which nested tube arrangement yields a higher-performance pinchlamp than is capable with a single-tube configuration. Further, each tube contains a separate gas, the inner tube filled with Argon, and the outer tube filled with Helium. The present invention is directed to such a two-tube configuration, and a pinchlamp utilizing a two-tube configuration.

The inner/outer coaxial tube arrangement of the present invention facilitates the use of an inner tube to contain a volume of Argon gas as the working gas. An outer tube, coaxial with the inner tube, surrounds the inner tube with contained Helium gas. The configuration of an outer tube filled with Helium presents a pressure means to apply external pressures to the inner tube. The contained Helium gas in the outer tube, among other things, compresses and supports the wall of the inner tube, enabling the inner tube to be smaller in diameter than prior art plasma chambers, which chambers would shatter if made with as small a diameter as the present inner tube.

The outer tube is but one embodiment of a pressure means to enable the smaller-dimensioned inner tube of the present invention to contain the plasma generation without structural failure.

The plasma pinch of the present invention can comprise more than two tubes. For example, the inner tube could itself be two nested tubes with water between them for cooling. Likewise, the outer tube could be two nested tubes with water in between for cooling.

Therefore, it is an object of the present invention to provide a new and improved plasma pinch.

It is another object of the present invention to provide a new and improved plasma pinch having an inner tube filled with working gas, which inner tube is of smaller diameter than present plasma chambers.

It is a further object of the present invention to provide a new and improved plasma pinch having an inner tube containing a smaller volume of working gas than present chambers, yet which inner tube is manufactured with wall materials and thicknesses currently used in conventional plasma chambers. Although, while conventional chambers would explode in use if produced to the dimensions of the present inner tube, the present plasma pinch provides sufficient pressures to the outer surface of the inner tube wall so as to maintain the integrity of the inner tube during use.

Yet another object of the present invention is to provide a plasma pinchlamp utilizing a two-tube plasma pinch.

It will be apparent to those skilled in the art that the present invention is applicable to a wide range of usages, including flashlamp devices, and is not limited to the present preferred embodiments.

These and other objects, features, and advantages of the present invention will be more apparent upon reading the following specification in conjunction with the accompanying drawing figures.

DETAILED DESCRIPTION OF THE PREFERRED EMBODIMENTS

Figure 1:
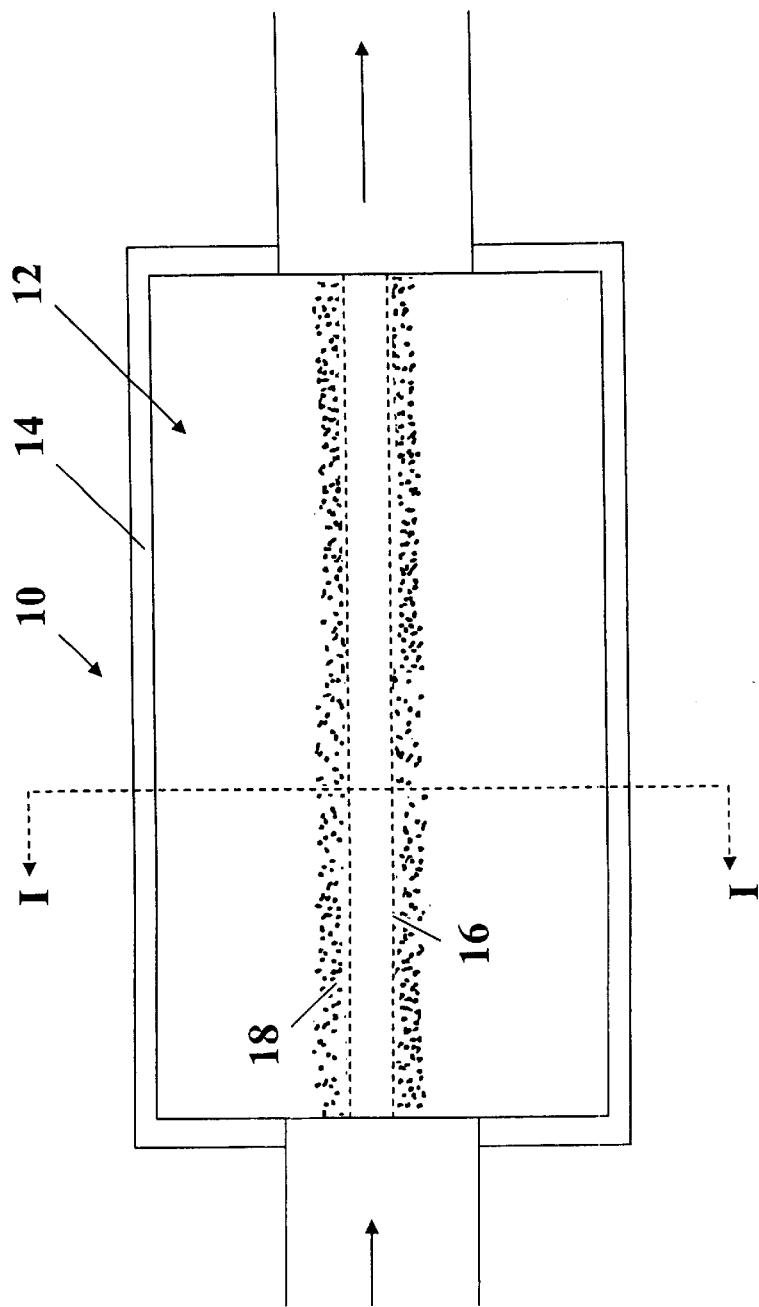
FIG. 1 is a schematic of a liquid-jet plasma pinch known in the art.
Figure 2:
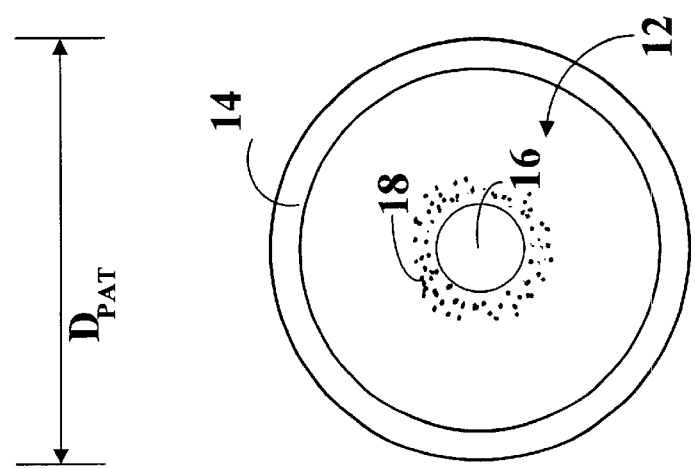
FIG. 2 is a sectional view along the plane I—I of the plasma pinch of FIG. 1.

Referring now in detail to the drawing figures, wherein like reference numerals represent like parts throughout the several views, FIGS. 1 and 2 show a prior art plasma pinch 10 for a liquid-jet pinchlamp. Such a liquid-jet pinchlamp is disclosed in U.S. Pat. No. 4,889,605, which is hereby incorporated by reference. The plasma pinch 10 generally includes a high vacuum 11 (viz., $10^{-6}$ mm Hg), contained inside a sealed chamber 14. A plasma source fluid-jet pinch device (not shown) establishes a central narrow preconditioned fluid channel, which is generally illustrated in broken lines at 16, for the plasma to be formed and pinched therealong, within the limited volume of the closed chamber 14. The fluid channel 16 is initially in the form of a stream of a liquid, such as decane or water, which flows under pressure through the chamber 14 that is kept at vacuum through the action of a vacuum pump (not shown). A vapor cloud 18 surrounds the liquid stream, and cooperates therewith to form the main pre-ionizing driver in the plasma pinch 10.

An electrical discharge device (not shown) directs an electrical current flow through the preconditioning vapor cloud 18 of liquid along the channel 16 to establish the plasma.

In operation, a fine stream of liquid flows under pressure between the end bulkheads, generally a pair of spaced-apart electrode assemblies at opposite ends of the chamber 14, and inside the chamber 14. The discharge device is thereafter activated for delivering a potential across the electrode assemblies to cause an electrical current initially through the vapor cloud 18. The stream absorbs the energy emanating from the low-density plasma 18, and is in turn radiatively heated. The liquid stream then becomes ionized, and is transformed into a high-Z dense plasma. The generated plasma then conducts the continuing discharge electrical current, and produces high-intensity ultraviolet light. The generated dense pinched plasma diverts most of the discharge electrical current from the surrounding low-density plasma, and conducts it along the channel 16 through the chamber 14. The resulting plasma is substantially stable, due to both magnetic and inertial forces, and is substantially uniform in cross section throughout its length.

The pinched plasma generates ultraviolet light. Further, the plasma is pulsed, and therefore becomes extinguished and then is re-established repeatedly in the plasma pinch.

As shown in FIGS. 1 and 2, the liquid-jet pinch embedded within a high vacuum 11. It is possible to place a working gas within the vacuum chamber and utilize even the vacuum ultraviolet radiation. In contrast, in the gas embedded configuration, a cold gaseous blanket surrounds and stabilizes the plasma pinch, and insulates it from the inner wall of the chamber 14. When such a pinch is formed in a high-Z gas 12, its copious ultraviolet production provokes electrical conductivity in the surrounding gaseous blanket through photolytic excitation. A conducting sheath may therefore form around the pinch, and may detract from its ohmic heating rate. At high densities, any of these materials may become optically dense, thereby radiating substantially as a blackbody.

A high-Z gas 12 in the pressure range of 0.02–2.00 atmospheres generally causes the pinched plasma to be in a thermodynamic equilibrium as well as an efficient source of vacuum ultraviolet radiation. As a "windowless" source of ultraviolet radiation, the high-Z gas-embedded plasma pinch becomes a potent means of photolyzing surrounding gases.

The diameter $D_{PAT}$ of the prior art tubes run in a general range of between 5–20 cm. A diameter in this range is sufficient to place the wall of the chamber far enough from the enclosed pinch so as not to shatter under normal working conditions.

Figure 3:
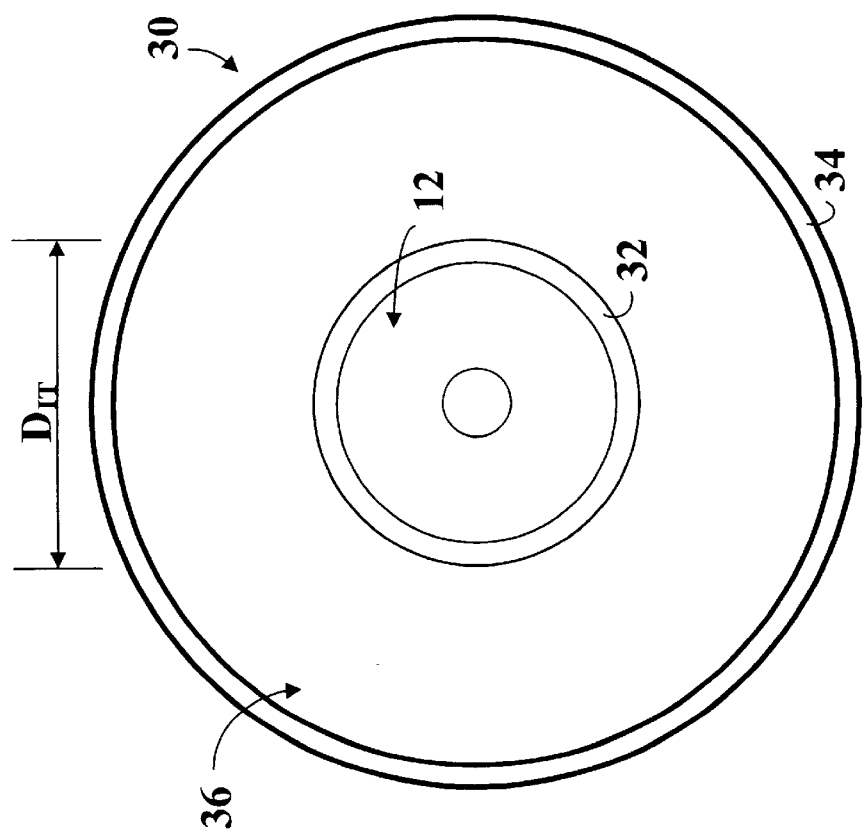
FIG. 3 shows a side sectional view of a plasma pinch of the present invention according to a preferred embodiment.

FIG. 3 is an illustration of the two-tube configuration 30 of the present invention. The two-tube configuration 30 of the present invention facilitates the use of a transparent inner tube 32 having a diameter $D_{IT}$ (a smaller-diameter tube as compared to prior art chambers), to contain a smaller volume of working gas 12 (as compared to prior art chambers). Compare FIGS. 2 and 3 as $D_{PAT} > D_{IT}$.

Preferably, the diameter $D_{IT}$ of the inner tube 32 is between 5–8 cm. A diameter in this range is sufficient to place the wall of inner tube 32 out of the range of direct contact with the plasma.

The present invention further comprises a pressure means in order to enable the smaller-dimensioned inner tube 32 to contain the plasma generation without structural failure. The preferable pressure means is, in part, an outer tube 34. As shown in FIG. 3, the inner tube 32 is encased and co-axially disposed within the outer tube 34.

As the inner tube 32 is subjected to the pressure means, the first parameter of designing an improved plasma pinch is satisfied. The diameter $D_{IT}$ of the inner tube 32 that contains the working gas 12 need not be maximized for the reasons dictated by the first parameter, because the function of the pressure means alleviates the consequence (shattering) of a conventional small-diameter inner tube. Thus, the wall of the inner tube 32 need not be as far as possible from the following so as not to shatter: (a) the heat of the plasma produced, (b) the shock wave from the production of the plasma, and (c) the pressures generated by the plasma. The pressure means prevents this damage to the inner tube 32. In a single-tube configuration, however, such a small tube would explode due to the shockwave and pressure rise from the hot pinch. However, in the present two-tube configuration, the pressure means compresses and supports the outer surface of the inner tube 32 to inhibit its explosion.

Generally, the inner tube 32 is hollow throughout its entire axial length. The outer tube 34 is coaxial with the inner tube 32. Both tubes 32, 34 can be uniform in cross-sectional shape, although such uniformity is not required. The cross-sectional shapes can vary, but are preferred as circular, oval or elliptical. Preferably, the inner tube 32 has a cross-sectional circular shape, so the pressure means subjected to the outer surface of the inner tube 32 is uniformly directed toward the axis of the inner tube 32, contributing to superior structural support.

The present invention also comprises the working gas 12 contained in the inner tube 32. Argon gas is an efficient light-generating working gas for the imbedded pinch, and has been found to produce preferable results in the pressure range of 1–4 atm. Other efficient light-generating gases include Neon, Xenon and Krypton. In the present configuration, there is less cold Argon gas surrounding the pinch to attenuate the pinch-produced light relative to prior art chambers. The second parameter for a superior plasma pinch is similarly satisfied, as the diameter of the inner tube 32 that contains the working gas 12 is minimized so the volume of the working gas 12, which is both cold and absorbing, is minimized.

One of the problems in dealing with pinches is their tendency to self-destruct by forming kinks and other instabilities. This problem is especially acute where the pinch is in a low pressure environment. In accordance with the present invention, the pinch is embedded in the working gas 12 under sufficient pressure to ameliorate the tendency of the plasma to destabilize.

The present invention further comprises an outer gas 36 contained within the outer tube 34. The outer tube 34 combined with the outer gas 36 provides the preferably pressure means of the present plasma pinch. The outer gas 36 is a low-Z gas, for example, Helium gas, to eliminate farther attenuation of the pinch-light in the additional thickness of the supporting gas blanket including both the working and outer gases 12, 36. It has been found that the preferable pressure range of the Helium is between 2–5 atm. Other low-Z gases include air, Hydrogen, Argon, Neon, Nitrogen and Carbon Monoxide. It is desired to have the outer gas 36 at a considerably higher pressure than the inner gas 12 to support the inner tube 32 as much as possible.

Preferably, the inner tube 32 is formed from sapphire, due to its strength and thermal resistance. Quartz, more readily available than sapphire and considerably lower in cost, can form the outer tube 34. Generally, the use of sapphire, instead of quartz, is particularly desirable for the following reasons: a higher power is attainable without envelope failure due to internal shock-waves; UV light optical transmission is better; a higher temperature can be withstood; and, a shorter wavelength of light is allowed to pass than is allowed utilizing a traditional quartz window. Specifically, quartz will allow the transmission of light greater than 170 nanometers in wavelength. Sapphire, on the other hand, allows for the transmission of light greater than approximately 150 nanometers in wavelength. The additional spectrum allowed to be utilized by the incorporation of a sapphire tube 32 and/or 34 provides for more light to be transmitted through the tubes.

It will be apparent to one skilled in the art, that many other materials may comprise the tubes 32, 34 of the present invention. Such materials will incorporate those qualities of quartz and sapphire, and improve upon these characteristics. While such characteristics of strength, refractory, temperature control and UV transmission are not generally found in glass, they are found in many other materials.

Preliminary experiments by the Applicant indicate that the inner/outer coaxial tube arrangement of the present invention can produce up to twice the output power of a comparable single-wall pinchlamp.

The double-tube Helium-blanket configuration of the present invention may also be useful to improve the performance of conventional Xenon flashlamps by using a high-pressure Helium blanket rather than a conventional water jacket at ambient pressure.

Figure 4:
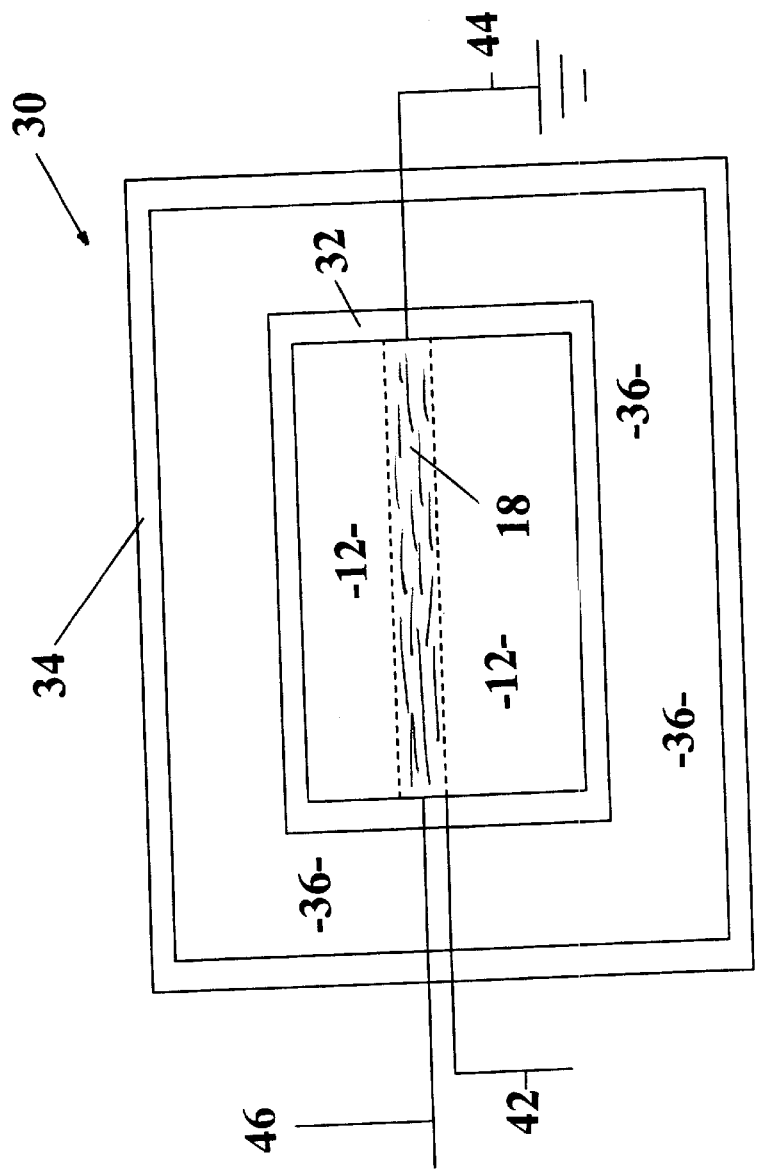
FIG. 4 is a schematic of a laser-guided, gas-embedded pinchlamp incorporating an embodiment of the present plasma pinch.

As shown in FIG. 4, the plasma pinch 30 of the present invention can be fitted in a laser-guided, gas-embedded pinchlamp device. The plasma pinch 30 of FIG. 4 incorporates pressurized working gas 12 in the inner tube 32. The hot radiating plasma 18 created during use is prevented from coming into contact with the walls of the inner tube 32 because of the "pinch" caused by the ionization of the working gas 12 directly effected by, preferably, a laser beam which creates a conductive path for a high powered electrical discharge from electrodes 42, 44. Preferably, the working gas is pressurized Argon gas 12, at between 2–4 atm., contained within the inner tube 32. Argon gas is both economical and electron donating. It should be appreciated that, for example, air, Neon, Xenon, Krypton, and other gases can be also used in place of Argon gas.

The pressure means comprising the outer tube 34 and contained outer gas 36 surrounds the inner tube 32. Helium gas as the outer gas 36 is preferable to air, allowing twice as much UV energy to strike the surface. Although Helium gas is preferred, other gases, including but not limited to Hydrogen, Argon, Neon, Nitrogen, Carbon Monoxide and air may be used.

The hot radiating plasma 18 subjects the inner tube 32 to shock waves and pressures that would shatter the inner tube 32 if not for the pressure means pressuring the inner tube 32 from the exterior.

The beam from a very small laser 44 is directed down the axis of the inner tube 32 creating a straight and narrow conductive path for the high electrical discharge to follow. The electrical discharge heats the dense Argon gas, which remains pinched into a narrow channel, to a very high temperature of generally 28,000° F., wherein copious amounts of radiation are produced. If the plasma 18 were to come into physical contact with the wall of the tube 32, the wall would be destroyed.

While the invention has been disclosed in its preferred forms, it will be apparent to those skilled in the art that many modifications, additions, and deletions can be made therein without departing from the spirit and scope of the invention and its equivalents, as set forth in the following claims.

What is claimed is:

1. A plasma pinch assembly for containing plasma, said plasma pinch assembly comprising:
   (a) an outer tube having a wall with an inner face;
   (b) an inner tube having a wall with an inner face and an outer face, said inner tube within and coaxial with said outer tube;
   (c) an outer gas contained between said inner face of said wall of said outer tube and said outer face of said wall of said inner tube; and
   (d) a working gas contained within said inner tube, said working gas capable of forming plasma;
   said outer gas being pressurized so as to subject said wall of said inner tube with pressure sufficient to enable said inner tube to contain plasma therewithin.

2. The plasma pinch assembly of claim 1, wherein said outer tube is formed of quartz.

3. The plasma pinch assembly of claim 2, wherein said inner tube is formed of sapphire.

4. The plasma pinch assembly of claim 1, wherein said outer gas is a low-Z gas.

5. The plasma pinch assembly of claim 1, wherein said working gas is capable of generating light upon plasma formation.

6. The plasma pinch assembly of claim 1, wherein said outer gas is selected from the group consisting of air, Helium, Hydrogen, Argon, Neon, Nitrogen and Carbon Monoxide.

7. The plasma pinch assembly of claim 1, wherein said inner gas is selected from the group consisting of air, Argon, Neon, Xenon and Krypton.

8. A method of containing plasma, said method comprising the steps of:
   (a) providing an outer tube having a wall with an inner face;
   (b) providing an inner tube having a wall with an inner face and an outer face, said inner tube within and coaxial with said outer tube;
   (c) providing an outer gas contained between said inner face of said wall of said outer tube and said outer face of said wall of said inner tube; and
   (d) providing a working gas contained within said inner tube, said working gas capable of forming the plasma;
   said outer gas being pressurized so as to subject said wall of said inner tube with pressure sufficient to enable said inner tube to contain the plasma therewithin.

9. The method of claim 8, wherein said outer tube is formed of quartz.

10. The method of claim 9, wherein said inner tube is formed of sapphire.

11. The plasma pinch assembly of claim 8, wherein said outer gas is a low-Z gas.

12. The plasma pinch assembly of claim 8, wherein said working gas is capable of generating light upon plasma formation.

13. The method of claim 8, wherein said outer gas is selected from the group consisting of air, Helium, Hydrogen, Argon, Neon, Nitrogen and Carbon Monoxide.

14. The method of claim 8, wherein said inner gas is selected from the group consisting of air, Argon, Neon, Xenon and Krypton.

15. In a plasma pinch assembly for containing plasma, the plasma pinch assembly having a chamber formed of chamber material with an inner face and an outer face, the chamber having a diameter $D_{CH}$, the chamber material having a thickness $T_{CH}$, the chamber so dimensioned capable of containing plasma, the improvement comprising:

(a) an inner tube formed of the chamber material with an inner face and an outer face, said inner tube having a diameter $D_T$, wherein $D_T<D_{CH}$, the chamber material of said inner tube having the thickness $T_{CH}$, said inner tube within and coaxial with the chamber;

(b) an outer gas contained between the inner face of the chamber and said outer face of said inner tube; and (c) a working gas contained within said inner tube, said working gas capable of forming plasma;

said outer gas being pressurized so as to subject said inner tube with pressure sufficient to enable said inner tube to contain plasma therewithin;

wherein without said pressurized outer gas, said inner tube is not capable of containing plasma due to structural failure of said inner tube.

16. The plasma pinch assembly of claim 15, wherein said chamber material is quartz.

17. The plasma pinch assembly of claim 15, wherein said chamber material is sapphire.

18. The plasma pinch assembly of claim 15, wherein said outer gas is selected from the group consisting of air, Helium, Hydrogen, Argon, Neon, Nitrogen and Carbon Monoxide.

\* \* \* \* \*